United States Patent
Kawaguchi et al.

(10) Patent No.: US 9,601,668 B2
(45) Date of Patent: Mar. 21, 2017

(54) LIGHT EMITTING DEVICE

(71) Applicant: NICHIA CORPORATION, Anan-shi (JP)

(72) Inventors: Hirofumi Kawaguchi, Tokushima (JP); Akinori Yoneda, Anan (JP); Kazuki Kashimoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/924,714

(22) Filed: Oct. 28, 2015

(65) Prior Publication Data

US 2016/0118548 A1    Apr. 28, 2016

(30) Foreign Application Priority Data

Oct. 28, 2014 (JP) .................................. 2014-219242
Oct. 23, 2015 (JP) .................................. 2015-208605

(51) Int. Cl.
*H01L 33/50* (2010.01)
*H01L 25/075* (2006.01)
(Continued)

(52) U.S. Cl.
CPC .......... *H01L 33/50* (2013.01); *H01L 25/0753* (2013.01); *H01L 33/56* (2013.01);
(Continued)

(58) Field of Classification Search
CPC ..... H01L 33/50; H01L 25/0753; H01L 33/36; H01L 33/46; H01L 33/486; H01L 33/56; H01L 2224/16225; H01L 2224/73253
See application file for complete search history.

(56) References Cited

U.S. PATENT DOCUMENTS

2009/0045416 A1\* 2/2009 Bierhuizen ............. H01L 33/46
                                                              257/88
2009/0179207 A1\* 7/2009 Chitnis ................... H01L 33/44
                                                              257/88
(Continued)

FOREIGN PATENT DOCUMENTS

JP    2010-219324    9/2010
JP    2011-134829    7/2011
(Continued)

*Primary Examiner* — Fernando L Toledo
*Assistant Examiner* — Neil Prasad
(74) *Attorney, Agent, or Firm* — Mori & Ward, LLP

(57) ABSTRACT

A light emitting device has a plurality of light emitting elements that are arranged with gaps between the devices on a mounting board in a first direction, a wavelength-conversion member that covers the plurality of light emitting elements, a light reflective resin. Each light emitting element has an n-type semiconductor layer, an active layer provided in a part of the n-type semiconductor layer, and a p-type semiconductor layer provided on the active layer. In a second direction which is perpendicular to the first direction, an n-side electrodes are provided at least in regions at both ends of the n-type semiconductor layer, and a p-side electrode is provided on the surface of the p-type semiconductor layer, and wherein in the second direction, the wavelength-conversion member is positioned to approximately align both sides with both active layer side faces, or to dispose its sides outward of the active layer side faces.

20 Claims, 7 Drawing Sheets

(51) Int. Cl.
  *H01L 33/56* (2010.01)
  *H01L 33/38* (2010.01)
(52) U.S. Cl.
  CPC .... *H01L 33/38* (2013.01); *H01L 2224/16225* (2013.01); *H01L 2224/73253* (2013.01)

(56) References Cited

U.S. PATENT DOCUMENTS

| | | | |
|---|---|---|---|
| 2010/0117997 A1* | 5/2010 | Haase | H01L 27/156 345/204 |
| 2012/0211774 A1 | 8/2012 | Harada | |
| 2012/0242216 A1 | 9/2012 | Kotani et al. | |
| 2013/0221389 A1* | 8/2013 | Yamamuro | H01L 33/50 257/98 |
| 2014/0240618 A1* | 8/2014 | Oraw | G06F 3/044 349/12 |

FOREIGN PATENT DOCUMENTS

| | | |
|---|---|---|
| JP | 2012-169442 | 9/2012 |
| JP | 2012-199411 | 10/2012 |

* cited by examiner

LIGHT EMITTING DEVICE

CROSS-REFERENCE TO RELATED APPLICATIONS

The present application claims priority under 35 U.S.C. 119 to Japanese Patent Application No. 2014-219242 filed Oct. 28, 2014 and Japanese Patent Application No. 2015-208605 filed Oct. 23, 2015. The contents of that application are incorporated herein by reference in their entirety.

BACKGROUND OF THE INVENTION

1. Field of the Invention

The present disclosure relates to a light emitting device.

2. Description of the Related Art

Light emitting elements such as light emitting diodes (LEDs) and laser diodes (LDs) are widely used in a variety of light source applications (e.g. backlight of liquid crystal display), general lightings, traffic signals, and wide-screen displays, or the like. In addition, recent advances of increase in light output have made light emitting elements a viable option for automobile headlight applications.

Currently, light emitting devices for applications required high light output, a plurality of light emitting elements, which are multilayer semiconductor formed on a substrate singularized, are arrayed with light reflective resin filling the region between the semiconductor elements. A high output light emitting device of this type that can also suppress luminous unevenness has been proposed by providing light reflective resin in the region between the semiconductor elements (e.g. refer to Japanese Unexamined Patent Publication 2011-134829).

However, previously proposed light emitting devices leave room for improvement with respect to luminous unevenness on the light-extraction surface, and recent demand calls for a light emitting device that can still further reduce luminous unevenness.

Accordingly, it is an object of the present invention to provide a light emitting device that can reduce luminous unevenness compared to devices currently in use.

SUMMARY OF THE INVENTION

To resolve the luminous unevenness issue noted above, a following device is presented. The light emitting device is provided with a mounting board, a plurality of light emitting elements arranged with gaps on the mounting board in a first direction, wavelength-conversion member disposed on the light extraction side of the light emitting elements in a manner covering the tops of the light emitting elements and the gaps between those elements, and light reflective resin that continuously covers perimeter regions of the light emitting elements and side surfaces of the wavelength-conversion member. Each of the plurality of light emitting elements has, in order from the light-extraction surface side, an n-type semiconductor layer, an active layer provided in a part of the n-type semiconductor layer, and a p-type semiconductor layer provided on the active layer. The n-side electrodes are provided at least in regions at both ends of the n-type semiconductor layer in a second direction, which is approximately perpendicular to the first direction, and a p-side electrode is provided on the surface of the p-type semiconductor layer. In the second direction, the wavelength-conversion member is positioned to approximately align both sides with both ends of the active layer, or to dispose its sides outward of the ends of the active layer.

The configuration described above makes it possible to provide a light emitting device with further improved luminance uniformity on the light-extraction surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
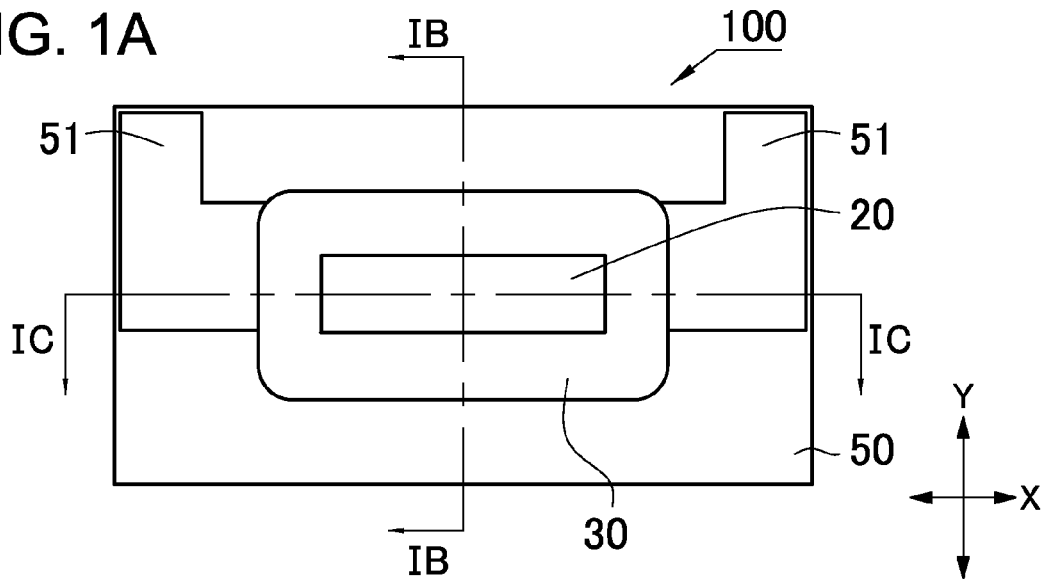
FIG. 1A is a schematic plan view showing a light emitting device according to the first embodiment.

The following describes embodiments of the present invention with reference to the accompanying drawings. Here, similar reference numbers designate corresponding or identical components in the drawings. However, the following descriptions of light emitting element and light emitting device are merely specific examples representative of the technology associated with the present invention, and the present invention is not limited to the implementations described below. Particularly, in the absence of specific annotation, structural component features described below such as dimensions, raw material, shape, and relative position are simply for the purpose of explicative example and are not intended to limit the scope of the invention. Properties such as the size and spatial relation of components shown in the figures may be exaggerated for the purpose of clear explanation. Further, a single component can serve multiple functions and a plurality of structural elements of the invention can be implemented with the same component. In contrast, the functions of a single component can be separated or distributed and implemented by a plurality of components. Also in the absence of any exclusionary annotation, individual elements and structures in the embodiments below can be applied in appropriate combination.

Further, in descriptions of light emitting devices and light emitting elements according to each embodiment of the present invention, directional terms such as above, below, left, and right may be interchanged depending on the situation. In the detailed descriptions of this application, directional terms indicate relative positions of structural elements with respect to the drawing being referenced, and unless explicitly noted, are not intended to indicate absolute position.

First Embodiment

Figure 1B:
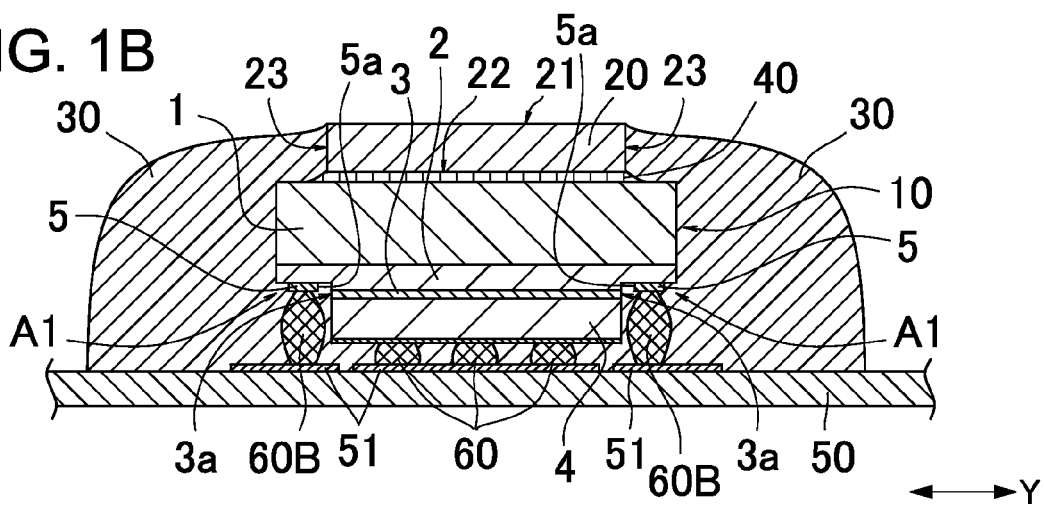
FIG. 1B is a schematic cross-section through the line IB-IB in FIG. 1A.
Figure 1C:
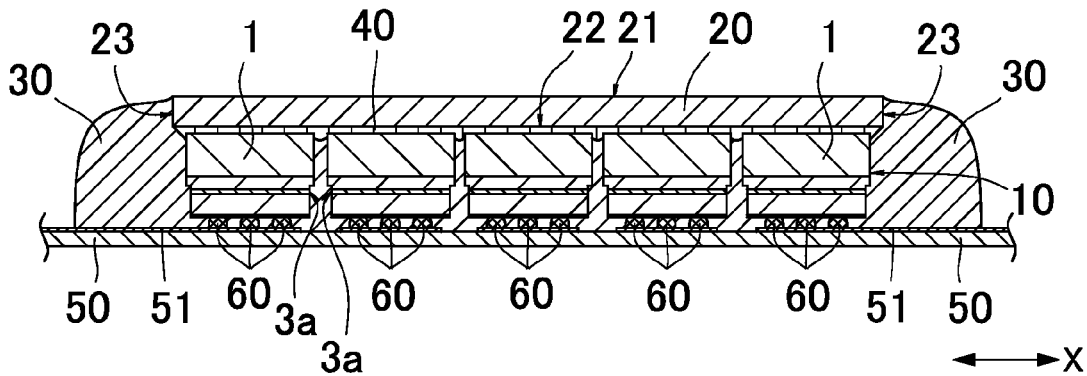
FIG. 1C is a schematic cross-section through the line IC-IC in FIG. 1A.
Figure 2:
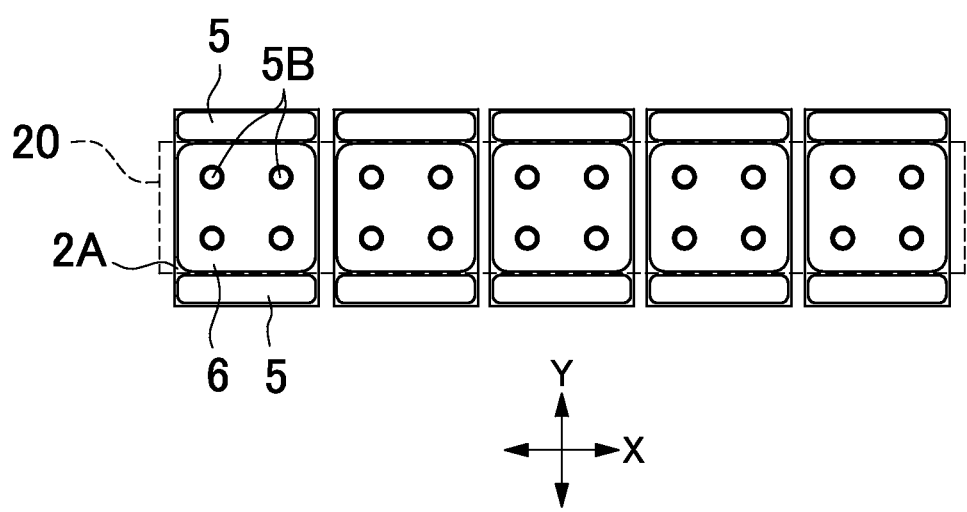
FIG. 2 is a schematic plan view showing the layout of light emitting elements according to the first embodiment.
Figure 3A:
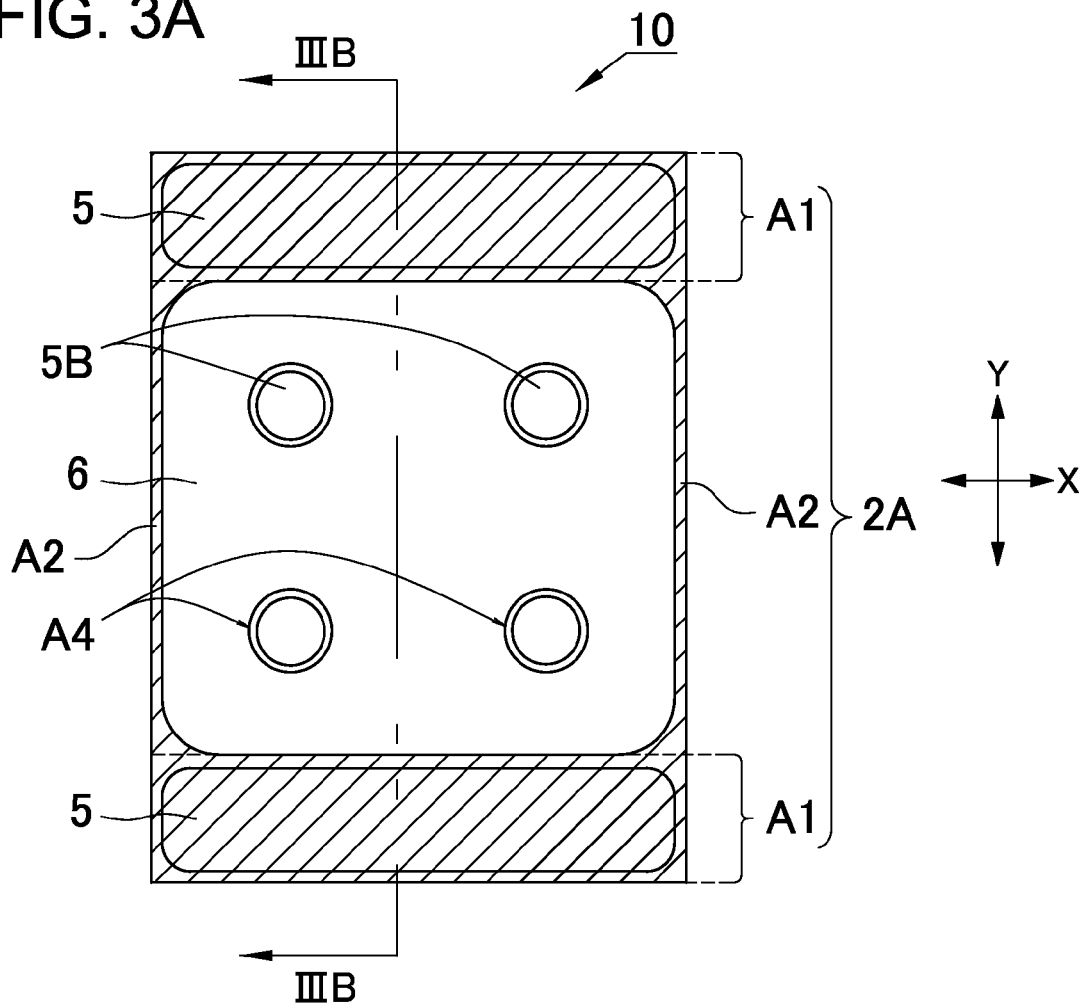
FIG. 3A is a schematic plan view showing a light emitting element according to the first embodiment.
Figure 3B:
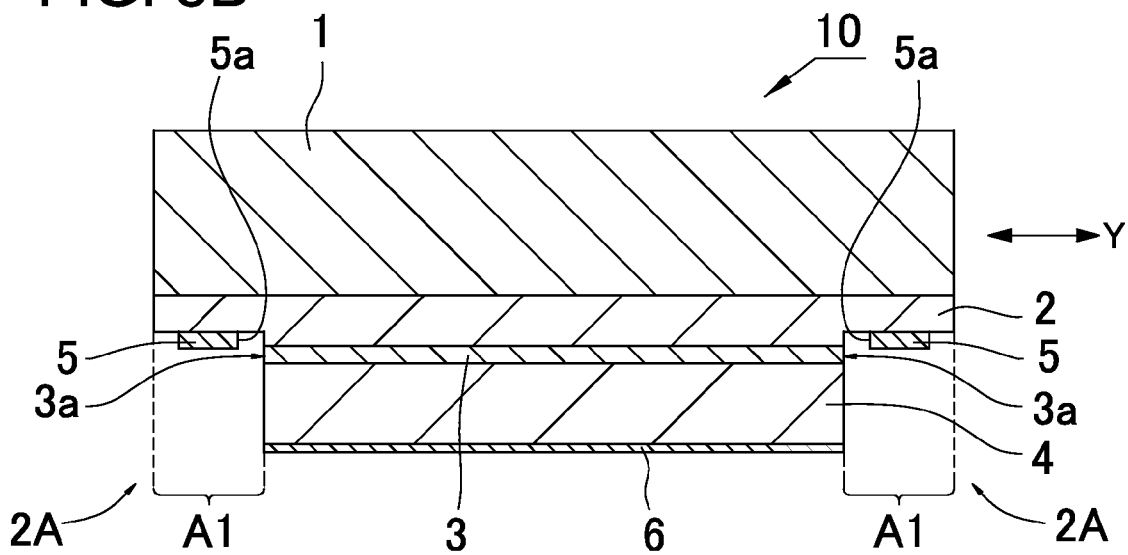
FIG. 3B is a schematic cross-section through the line IIIB-IIIB in FIG. 3A.

FIGS. 1A-3B show a light emitting device 100 according to the first embodiment of the present invention. FIG. 1A is a schematic plan view, FIG. 1B is a schematic cross-section through the line IB-IB in FIG. 1A, FIG. 1C is a schematic cross-section through the line IC-IC in FIG. 1A, FIG. 2 is a schematic plan view of light emitting elements 10 arranged in a row in a first direction X of the light emitting device 100, FIG. 3A is a schematic plan view of a light emitting element 10, and FIG. 3B is a schematic cross-section through the line IIIB-IIIB in FIG. 3A. As shown in FIGS. 1A-3B, the light emitting device 100 according to the first embodiment is provided with a mounting board 50, a plurality of light emitting elements 10 arranged on the mounting board 50 with gaps in a row in the first direction X, wavelength-conversion member 20 disposed on the light extraction surface 21 side of the light emitting elements 10 so as to cover the tops of the light emitting elements 10 and the gaps between those elements, and a light reflective resin 30 that covers perimeter regions of the light emitting elements 10 and side surfaces of the wavelength-conversion member 20. Each of the plurality of light emitting elements 10 has, in order from the light-extraction surface 21 side, an n-type semiconductor layer 2, an active layer 3 provided in a part of the n-type semiconductor layer 2, and a p-type semiconductor layer 4 provided on the active layer 3. N-side electrodes 5 are provided on at least regions at both ends A1 of the n-type semiconductor layer 2 in a second direction Y, which is perpendicular to the first direction X, and a p-side electrode 6 is provided on the surface of the p-type semiconductor layer 4. In the second direction Y, the wavelength-conversion member 20 is positioned to approximately align both sides with both ends of the active layer 3, or to dispose its sides outward of the ends of the active layer 3. As shown in FIG. 2 and the like, since n-side electrodes 5 of the light emitting device 100 according to the first embodiment are principally disposed at both ends in the second direction Y, a light emitting device 100 can be produced that suppresses light absorption by the n-side electrodes 5, and also reduces luminous unevenness on the light-extraction surface. Further details are described below.

The light emitting device 100 shown in FIGS. 1A-3B is primarily configured as a plurality of light emitting elements 10, each of which has a semiconductor lamination formed on a light-transmissive substrate 1, wavelength-conversion member 20, which transmits light from the light emitting elements 10, and the light reflective resin 30, which covers perimeter regions of the light emitting elements 10 and a part of the wavelength-conversion member 20. As shown in FIGS. 1B-1C and the like, the wavelength-conversion member 20 has a light-extraction surface 21, a light incident surface 22 on the opposite side from the light-extraction surface 21, and side surfaces 23. The plurality of light emitting elements 10 are arranged on the mounting board 50 in a row in the first direction X, and each light emitting element 10 is mounted face-down (in "flip-chip" manner) with the surface of the light-transmissive substrate 1 facing the light incident surface 22 of the wavelength-conversion member 20 as shown in FIG. 1C. The wavelength-conversion member 20 is joined to the light-transmissive substrates 1 of the light emitting elements 10 via adhesive material 40 in a manner that straddles the plurality of light emitting elements 10 and covers the tops of those elements as well as the gaps between elements. Since the perimeters of the light emitting elements 10 mounted on a mounting board 50 and the side surfaces 23 of the wavelength-conversion member 20 are covered by the light reflective resin 30, an area in which the light is extracted from the light emitting device 100 is essentially confined to the upper surface, i.e., the light-extraction surface 21 of the wavelength-conversion member 20.

(Light Emitting Element 10)

As shown in FIGS. 1A-2, light emitting elements 10 according to the first embodiment are arranged in a row in the first direction X on the mounting board 50. As shown in FIGS. 3A and 3B, each light emitting element 10 is formed in a rectangular shape, and is provided with a light-transmissive substrate 1, a semiconductor lamination, n-side electrodes 5 connected to the n-type semiconductor layer 2, and a p-side electrode 6 connected to the p-type semiconductor layer 4 included in the semiconductor lamination. A light emitting element 10 according to the first embodiment has an n-type semiconductor layer 2, an active layer 3, and a p-type semiconductor layer 4 formed on the light-transmissive substrate 1. The n-side electrodes 5 and A-side electrode 6 are formed on one side of the light emitting element 10 making the structure suitable for face-down mounting.

The light-transmissive substrate 1 is a substrate suitable for growing semiconductor layers in an epitaxial manner. For example, in the case where the semiconductor layers is formed by using semiconductor nitrides such as gallium nitride, the substrate can be insulating material such as sapphire ($Al_2O_3$) or spinel ($MgAl_2O_4$) of which one of C-plane, R-plane, or A-plane becomes a main surface, SiC, ZnS, ZnO, Si, GaAs, diamond, or oxides that can match the lattice constant of semiconductor nitrides such as lithium niobate ($LiNbO_3$) or neodymium gallium oxide. In the case of semiconductor nitrides, the semiconductor layers can be grown epitaxially on suitable light-transmissive substrates by using methods known in the industry such as metal organic chemical vapor deposition (MOCVD), hydride vapor phase epitaxy (HVPE), or molecular beam epitaxy (MBE).

As above stated, in order from the light-extraction surface 21 side of the wavelength conversion member 20, an n-type semiconductor layer 2, an active layer 3 provided in a part of the n-type semiconductor layer 2, and a p-type semiconductor layer 4 provided on the active layer 3 are formed on the lower surface of the light-transmissive substrate 1. Said differently, the light emitting element 10 is configured as an n-type semiconductor layer 2, an active layer 3, and a p-type semiconductor layer 4 laminated on the primary surface on one side of the light-transmissive substrate 1 in this order.

As shown in FIGS. 3A and 3B, there are local regions of the light emitting element 10 where no p-type semiconductor layer 4 or active layer 3 are formed. Specifically, those regions are recessed from the upper surface of the p-type semiconductor layer 4 and form an exposed area 2A that exposes the n-type semiconductor layer 2. As shown in FIG. 3A, in the first embodiment, the exposed area 2A includes end region A1 at both ends of the light emitting element 10 in the second direction Y (upper and lower ends illustrated in FIG. 3A), and edge regions A2 along the perimeter of the p-side electrode 6, which are positioned at right and left sides of the p-side electrode 6 in FIG. 3A, respectively. The exposed area 2A according to the first embodiment corresponds with hatched area illustrated in FIG. 3A. As shown in FIG. 3B, the end regions A1 are positioned outside the side faces of the p-type semiconductor layer 4 or outside the side faces 3a of the active layer 3. The n-side electrodes 5 are primarily provided in the two end regions A1 and are not provided in perimeter edge regions A2. As shown in FIG. 1C, providing n-side electrodes 5 in both end regions A1 rather than in perimeter edge regions A2 reduces light absorption due to n-side electrodes between light emitting elements 10 when they are arranged in a row in the first direction X of the light emitting device 100. As a result, luminous unevenness in the first direction X of the light-extraction surface 21 can be improved. The perimeter regions A2 is a portion of boundary region of the dividing line along the region of which the light emitting elements 10 in the state of wafer is singularized in pieces (street for dicing). The width of the dividing line can be, for example, about 5.0 µm to 50 µm in the first direction X. Also as shown in FIG. 3A, holes A4 can be provided as part of the exposed area even within the light extraction area of the light emitting element 10, and n-side electrodes 5B can be formed at the bottom of the holes A4. Note that while the exposed area 2A may be locally covered with a protection layer to protect the n-side electrodes 5 or the light emitting element 10, that area is called "exposed area" for convenience. Also, FIGS. 2 and 3A depict wavelength-conversion member and light-transmissive substrate as transparent for illustrative purpose.

As shown in FIG. 1C, a plurality of light emitting elements 10 are arranged in a row in the first direction X with gaps between elements. It is preferable to dispose the light emitting elements 10 with the side faces 3a of adjacent light emitting elements 10 contiguous in the first direction X. This can moderate luminance reduction between the semiconductor light emitting elements 10 in the row of elements, and can improve the luminous unevenness of the light emitting device 100 in the first direction X of the light-extraction surface 21. For example, when the light emitting elements 10 are arranged in a row in the first direction X with active layer side faces 3a next to each other, distance between the adjacent active layer side faces 3a including the perimeter edge regions A2 is preferably about 0.01 µm to 0.5 µm, and more preferably about 0.005 µm to 0.2 µm.

Semiconductors such as $In_xAl_yGa_{1-X-Y}N$, ($0 \leq X$, $0 \leq Y$, $0 \leq X+Y \leq 1$) can be suitably employed as the n-type semiconductor layer 2, the active layer 3, and the p-type semiconductor layer 4. Each semiconductor layer can have a single-layer structure, a multi-layer structure including film layers that differ in conditions such as composition or thickness, or a super-lattice structure. In particular, it is preferable to configure the active layer as a laminate of thin films that take advantage of quantum effects as in a single or multiple quantum well structure.

Further, with the exception of n-side electrode 5 and p-side electrode 6 surfaces where conductive bonding material 60 described below makes contact, exposed surfaces of the n-type semiconductor layer 2, active layer 3, and p-type semiconductor layer 4 are preferably covered with a transmissive insulating protection layer.

The n-side electrodes 5 and p-side electrode 6 serve as electrode terminals for supplying external power to the light emitting element 10. As shown in FIG. 3A, the n-side electrodes 5 are provided at both end regions A1 in the second direction Y of the light emitting element 10 and are electrically connected to the n-type semiconductor layer 2. This can make current density uniform throughout the light emitting region, and can improve luminous unevenness in the light emitting element 10. Further, since the n-side electrode 5 area is large, forward voltage Vf can be reduced. The p-side electrode 6 is provided on the p-type semiconductor layer 4 and is electrically connected to the p-type semiconductor layer 4. Also as shown in FIG. 3A, additional n-side electrodes 5B can be provided at holes A4 that expose the n-type semiconductor layer 2.

The n-side electrodes 5 and p-side electrode 6 can be formed with metals such as Ti, Pt, Au, Rh, W, and Ni, or alloys of those metals. Single layers or multi-layer laminates of those metallic materials can be used to form the electrode structures.

(Wavelength Conversion Member 20)

The wavelength conversion member 20 includes wavelength conversion substances, or the like capable of converting at least a portion of the light emitted by the light emitting elements 10 to a different wavelength.

The wavelength-conversion member 20 can include fluorescent material or phosphor particles as wavelength conversion substances. For example, light of a different wavelength than that emitted by the light emitting elements 10 can be produced by optical excitation of phosphor included as wavelength conversion substances in the wavelength conversion member 20. In addition, mixing of light from the light emitting elements 10 and light resulting from phosphor excitation can produce light with a desired color tone. In the plane view, the wavelength conversion member 20 for the first embodiment has its upper surface, which forms the light-extraction surface 21, exposed from the top of the light emitting device 100 and has its bottom surface, which forms the light incident surface 22, joined to upper surfaces of the light-transmissive substrates 1 via adhesive material 40. The side surfaces 23 of the wavelength-conversion member 20 are covered by the light reflective resin 30 described below.

As shown in FIG. 1B, in the second direction Y, both side surfaces 23 of the wavelength-conversion member 20 for the first embodiment are positioned approximately in the same plane as the side faces 3a at both ends of the active layer 3. Accordingly, the surface area of the light incident surface 22 of the wavelength conversion member 20 can be increased compared to a configuration where each wavelength conversion member side surface 23 is positioned inward of each respective active layer side face 3a. Since this makes it easier to extract light produced in the active layer 3, the light emission efficiency of the light emitting device 100 can be improved. Further, a configuration where each wavelength conversion member side surface 23 is positioned outward in the second direction Y of each respective active layer side face 3a is also possible. Since this structure increases the surface area of the wavelength conversion member light-extraction surface 21, the light emission efficiency of the light emitting device 100 can be further improved.

It is further preferable to position each wavelength conversion member side surface 23 in the second direction Y between each respective active layer side face 3a and the inward facing side 5a of the adjacent n-side electrode 5. This can reduce the amount of light that incident on the wavelength conversion member 20, converted to a different wavelength, redirected towards the mounting board 50, and then absorbed by the n-side electrode 5. Consequently, it can improve color unevenness of the light emitting device 100. Here, the inward facing side 5a of an n-side electrode 5 is the side surface of the n-side electrode 5 that faces the side face 3a of the active layer 3 in the second direction Y.

Materials such as glass, ceramics, and resin can be used as the base material of the wavelength conversion member 20, and phosphor can be suitably included in those base materials. For example, from a reliability standpoint, glass which contains phosphor and ceramic which contains phosphor are preferable. In addition to phosphor, the wavelength conversion member 20 can also include light scattering agent. As light scattering agent, at least one oxide of the elements Ti, Zr, Nb, Al, and Si; or at least one of the compounds AlN and MgF can be selected. Particularly, at least one of the compounds $TiO_2$, $ZrO_2$, $Nb_2O_5$, $Al_2O_3$, MgF, AlN, and $SiO_2$ can be selected as light scattering agent. In particular, it is preferable to select an oxide of one of the elements Ti, Zr, Nb, and Al as light scattering agent particulates. This type of light scattering agent has high reflectivity and low light absorption properties, and can increase the refractive index difference with respect to the base material of the wavelength conversion member 20.

The form of the wavelength-conversion member 20 is not particularly limited and can have a shape such as a flat-plate. However, the wavelength-conversion member 20 is not limited to a flat-plate, and can have various shapes or forms including wholly or partially curved surfaces as well as surfaces with convex and concave. For example, the wavelength-conversion member 20 can be shaped to focus or disperse light, and can have a lens shape or other optically effective shape.

A thickness of the wavelength conversion member 20 is set according to the amount of phosphor included and the targeted color tone for color-mixed light, which is light emitted by the light emitting elements 10 mixed with light converted in wavelength by phosphor interaction. For example, the thickness about 10 μm to 500 μm is preferable, and the thickness about 50 μm to 300 μm is even more preferable.

Phosphor material that is suitably mixed with blue light which emitted from the light emitting elements 10 to produce white-light is preferable as the phosphor included in the wavelength-conversion member 20. For example, garnet-structured cerium-activated yttrium-aluminum-garnet [YAG] based phosphor material and lutetium-aluminum-garnet [LAG] based phosphor material can be used individually or in combination.

(Light Reflective Resin 30)

The light reflective resin 30 has light scattering material included in a resin base, and is provided to principally reflect light from the light emitting elements 10 and wavelength converted light from the wavelength-conversion member 20. As shown in FIGS. 1A-1C, the light reflective resin 30 for the first embodiment continuously covers perimeter regions of the light emitting element 10 and side surfaces 23 of the wavelength-conversion member 20, and the upper surface of the wavelength-conversion member 20 is exposed from the light reflective resin 30 enclosure in the plane view. For practical purposes, this limits the area for extracting light from the light emitting elements 10 to the upper surface of the wavelength-conversion member 20 only; namely to the light-extraction surface 21 only. Specifically, a structure where a light source section which includes the light emitting elements 10 and the wavelength-conversion member 20 is covered except the light-extraction surface 21 is preferable. Covering the wavelength-conversion member 20 up to the side surfaces with the light reflective resin 30 suppresses leakage of light from the side surfaces 23 of the wavelength-conversion member 20 and can improve the sharpness in luminance leakage at edges of light emitting device 100.

It is preferable for the light reflective resin 30 to cover end regions A1 in the second direction Y where the n-side electrodes 5 are provided. This can reflect light which is first reflected towards the mounting board 50 by the light reflective resin 30 and the light incident surface 22 of the wavelength-conversion member 20 towards the light-extraction surface 21 side, and can improve the light emission efficiency of the light emitting device 100. It is also preferable for the light reflective resin 30 to cover the side surfaces of the light emitting elements 10, which include the side surfaces of the light-transmissive substrate 1 and the n-type semiconductor layer 2. This can suppress light leakage from the side surfaces of the light emitting elements 10. As shown in FIGS. 1B and 1C, while the upper surface of the light reflective resin 30 is roughly in the same plane as the light-extraction surface 21 of the wavelength-conversion member 20, it is preferable for the surface of the light reflective resin 30 to be slightly recessed relative to the light-extraction surface 21 to prevent any blockage of light by the light reflective resin 30.

It is preferable to use a light-transmitting resin such as a silicone resin composition or modified silicone resin composition as the base material of the light reflective resin 30. From heat resistance and environmental resistance considerations, silicone resin is selected for use as the resin material for the first embodiment. Since the light reflective resin 30 is made by a resin-base material, it is easy to be formed in a desired shape and cover targeted regions of the light emitting device 100. In addition, the exposed surface of the light reflective resin 30 on the light-extraction surface 21 side can be formed in a selected shape such as a surface with concave or convex curvature as well as a planar surface.

Particulates with low light absorption properties are preferable for use as the light scattering material included in the base material of the light reflective resin 30. For example, at least one oxide of the elements Ti, Zr, Nb, Al, and Si; or at least one of AlN and MgF can be selected as the light scattering material. Namely, at least one of the compounds $TiO_2$, $ZrO_2$, $Nb_2O_5$, $Al_2O_3$, MgF, AlN, and $SiO_2$ can be selected as light scattering material. Since use of this type of light scattering material can produce the light reflective resin 30 with highly reflective and low absorption property, light absorption and light loss can be reduced. From light reflection and light absorption property considerations, TiO2 is selected for use as the light scattering material for the first embodiment.

Since the leakage of light from the light reflective resin 30 depends on conditions such as the concentration and density of the contained light scattering material, those conditions can be adjusted according to the size and shape of the light emitting device 100. For example, for a relatively small light emitting device 100 having the light reflective resin 30 formed with little thickness, use of the light reflective resin 30 having a high concentration of light scattering material is preferable. In particular, the concentration of light scattering material and the thickness of the light reflective resin 30 provided above the light-transmissive substrate 1 in the plane view has a major effect on improving the sharpness in luminance of light emitting devices 100.

For example, good results can be obtained by making the concentration of light scattering material in the light reflective resin about 20 wt % to 50 wt % and by making resin thickness about 100 μm to 300 μm. A light emitting device 100 with this type of the light reflective resin 30, it can only mitigate sharp-edged light emission, but can also produce high luminance and highly directive light from the light-extraction surface 21. Use of the light reflective resin 30 having suitable viscosity facilitates forming under fill. Further, by increasing the concentration of light scattering material, thermal diffusivity of the light reflective resin 30 can be improved.

(Adhesive Material 40)

The adhesive material 40 is a bonding agent that intervenes between the wavelength-conversion member 20 and the light emitting elements 10 to securely adhere those components. It is preferable that the adhesive material 40 is light transmissive, can guide light from the light emitting elements 10 towards the wavelength-conversion member 20, and can optically couple the light emitting elements 10 and the wavelength-conversion member 20. Light transmissive thermo-setting resins such as silicone resin or epoxy resin can be used as the adhesive material 40, and silicone resin is particularly preferable due to its good heat and optical resistance. Silicone resin is employed as the adhesive material 40 in the first embodiment.

The adhesive material 40 can be extended to an outer area of the wavelength-conversion member 20 in the plan view. For example, as shown in FIG. 1B, the adhesive material 40 can be disposed on the surface of the light-transmissive substrate 1 with perimeter surfaces that incline up to the side surface 23 edges of the wavelength-conversion member 20. This configuration can efficiently guide light from the light emitting elements 10 to the light incident surface 22 of the wavelength-conversion member 20, and can reduce the amount of light reflected back towards the mounting board 50 by the light reflective resin 30. As a result, the amount of light absorbed by the n-side electrodes 5 can be reduced and light emission efficiency can be improved.

(Mounting Board 50)

For the light emitting device 100 in FIG. 1, a board or substrate, which has conductive wiring parts 51 for electrical connection to the electrodes of the light emitting element 10 formed at least on the upper surface, can be used as the mounting board 50 for mounting light emitting elements 10. Since ceramics such as aluminum nitride and alumina have good heat dissipation properties, those types of materials can be used with good results as materials of mounting board 50. Further, as shown in figures such as FIGS. 1B and 1C, for external electrical connection, light emitting elements 10 are bonded on the conductive wiring parts 51 via conductive bonding material 60. Materials such as gold bumps, solder, or silver past can be used as the conductive bonding material 60. Gold bumps are adopted as the conductive bonding material 60 for the first embodiment.

(Manufacturing Method of Light Emitting Device 100)

The following describes one example of a method of manufacturing the light emitting device 100 shown in FIG. 1. First, gold bumps are formed as conductive bonding material 60 on the conductive wiring parts 51 of the mounting board 50 or on the light emitting elements 10, and the light emitting elements 10 are mounted in "flip-chip" manner on the mounting board 50. Next, wavelength-conversion member 20 is attached on top of the light-transmissive substrates 1 of the light emitting elements 10 via adhesive material 40. Here, the wavelength-conversion member 20 is disposed to over all of the plurality of light emitting elements 10. Next, resin is flowed into regions between the light emitting elements 10 and the mounting board 50 as under-fill, and that resin is hardened. Here, the resin used for "under-fill" has a lower viscosity than that of the light reflective resin 30. Subsequently, a resin frame is formed with the light reflective resin 30 to surround the plurality of light emitting elements 10 mounted on the mounting board 50, and that resin is pre-hardened. Finally, the light reflective resin 30 is flowed into the region between the frame of the light reflective resin 30 and the light emitting elements 10 and hardened. This can manufacture a light emitting device 100 according to the first embodiment with good manufacturability.

Second Embodiment

Figure 4:
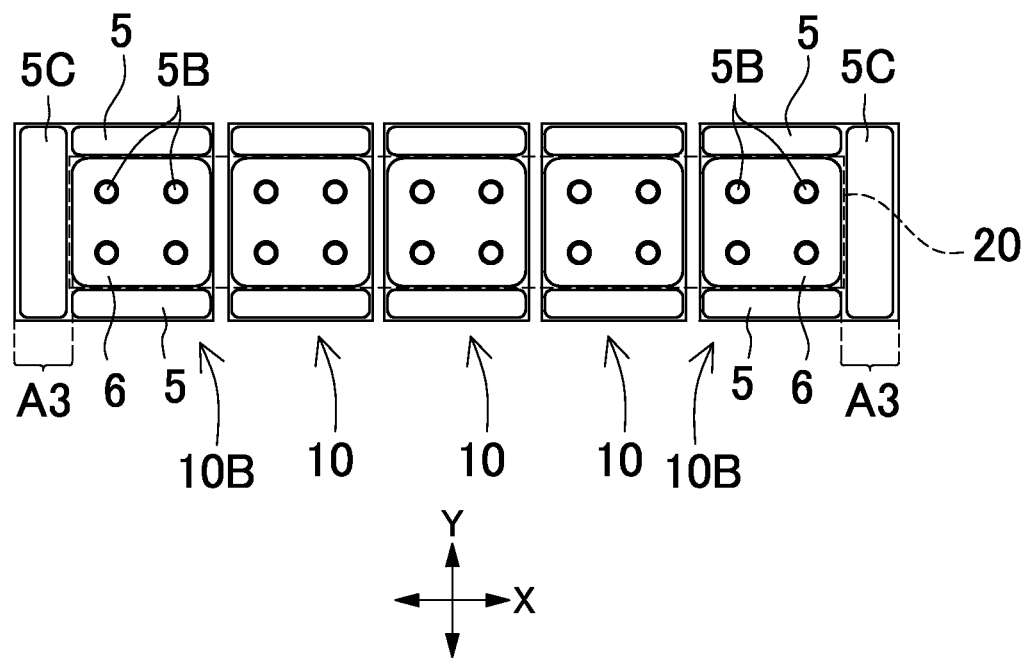
FIG. 4 is a schematic plan view showing light emitting elements according to the second embodiment.

Light emitting device according to the second embodiment are shown in the schematic plan view of FIG. 4. Other than light emitting element 10 structure, component parts of a light emitting device that includes the light emitting elements 10 shown in FIG. 4 are essentially the same as that of the above described first embodiment. Accordingly, similar components are indicated by the same reference numbers and for expediency their description is not repeated.

As shown in FIG. 4, light emitting elements 10B at both ends of the row of light emitting elements 10 aligned in the first direction X have extended areas A3 that extend beyond the ends of the wavelength-conversion member 20 in the first direction X as shown in dashed line in FIG. 4. The extended areas A3 are parts of the exposed area 2A which exposes n-type semiconductor layer 2, and the extended areas A3 are formed in a manner continuous with the n-type semiconductor layers 2 of the light emitting elements 10B. In a case of viewed from above, the greater parts of the extended areas A3 is positioned outside the light-extraction surface of the wavelength-conversion member 20. Consequently, by providing n-side electrodes 5C on the surfaces of the extended areas A3, electrode area can be increased without making the degree of luminous unevenness worse. Additionally, the forward voltage Vf of the light emitting device 100 can be reduced.

Third Embodiment

Figure 5A:
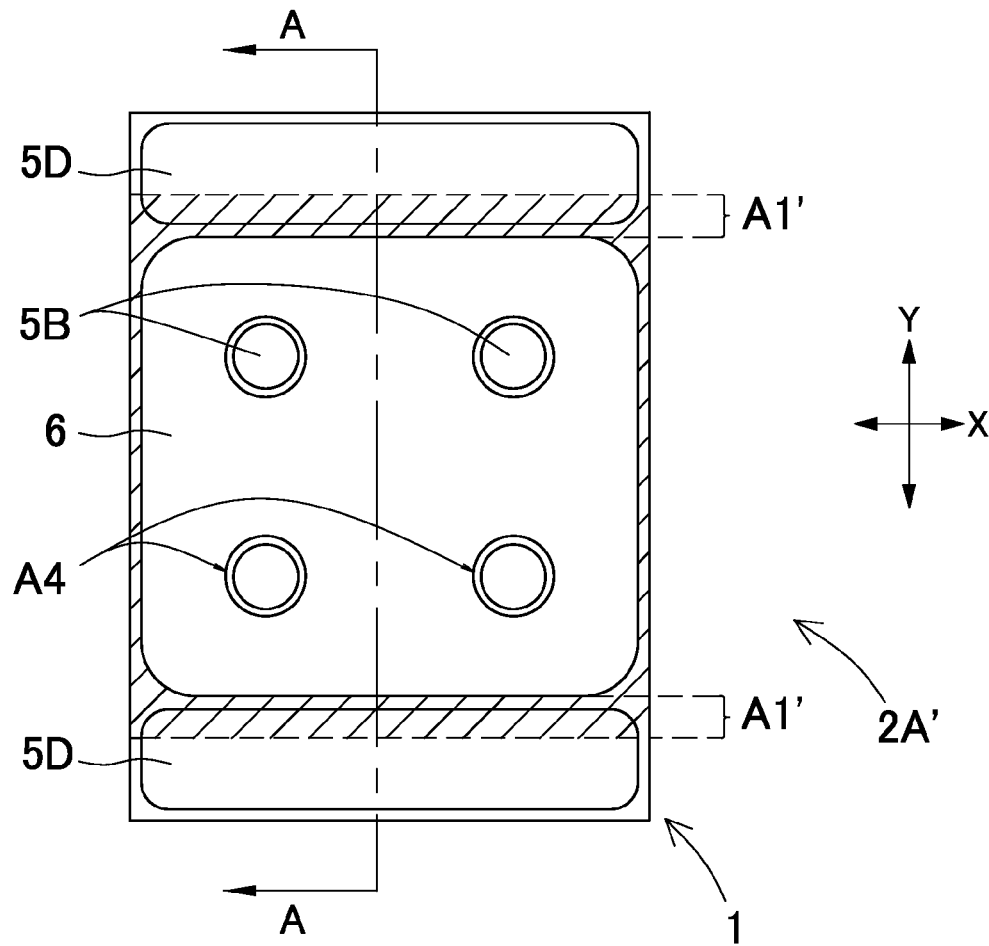
FIG. 5A is a schematic plan view showing a light emitting element according to the third embodiment.
Figure 5B:
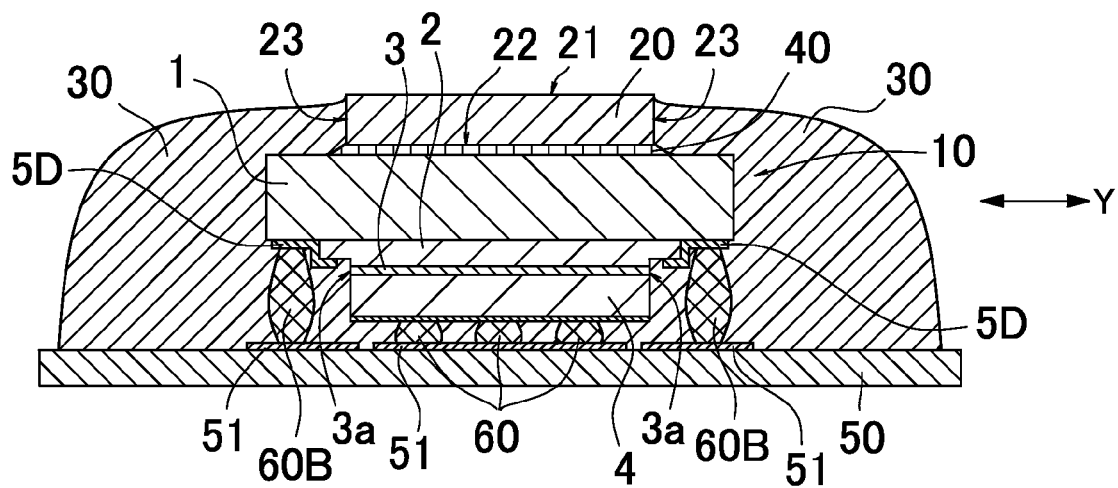
FIG. 5B is a schematic cross-section of a light emitting device having the light emitting element shown in FIG. 5A.

Light emitting device according to the third embodiment are shown in FIGS. 5A-5B. FIG. 5A is a schematic plan view of the light emitting element 10, FIG. 5B is a schematic cross-section of the light emitting device having the light emitting element 10 shown in FIG. 5A. It should be noted that FIG. 5B includes schematic cross-section of the light emitting element 10 through the line A-A in FIG. 5A. Other than light emitting element 10 structure shown in FIGS. 5A-5B, component parts of light emitting devices according to the third embodiment are essentially the same as above described in the first embodiment. Accordingly, similar components are indicated by the same reference numbers and for expediency their description is not repeated. In addition, hatched areas in FIG. 5A indicate exposed area 2A.

As shown in FIG. 5B, light-transmissive substrate 1 extends in the second direction Y beyond exposed n-type semiconductor layer 2 in end regions A1', and n-side electrodes 5D are provided that span over adjacent end regions A1' and the light-transmissive substrate 1 at both ends. Specifically, the n-side electrodes 5D are provided in order to continuously cover the end regions A1 of the n-type semiconductor layer 2, side faces of the n-type semiconductor layer 2, and the light-transmissive substrate 1 surfaces that are exposed at both end regions in the second direction Y. This structure allows the distance between active layer side faces 3a and conductive bonding material 60B to be increased. Since this allows the thickness of the light reflective resin 30 between side faces 3a of active layer and conductive bonding material 60B to be increased, light absorption by the conductive bonding material 60 can be suppressed and light emission efficiency can be improved. Here, it is preferable to cover exposed n-side electrode 5D area with the light reflective resin 30 at least over the light-transmissive substrate 1.

Figure 6:
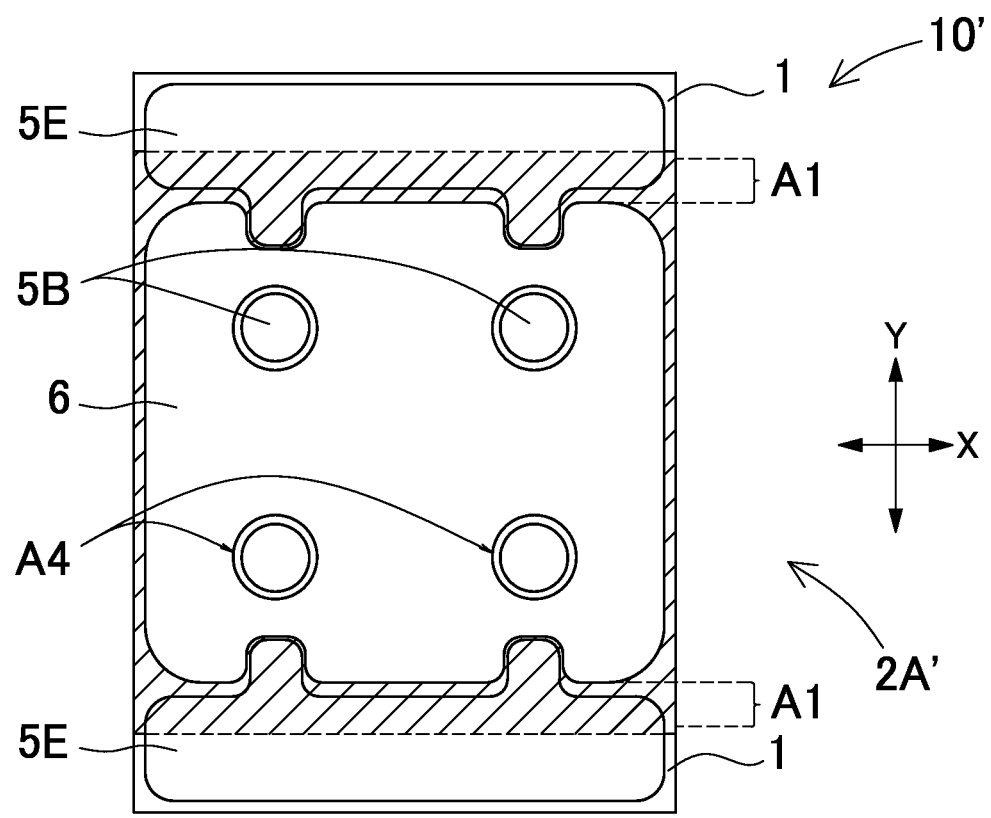
FIG. 6 is a schematic plan view showing a light emitting element according to a variation.

Further, as shown in FIG. 6 illustrating a light emitting element 10' according to a variation, n-side electrodes 5E formed in end regions A1 can also extend locally into regions under the wavelength-conversion member. Although this configuration slightly reduces active layer 3 area, it can increase the surface area of electrode in contact with the n-type semiconductor layer 2 and reduce forward voltage Vf compared to the structures of FIGS. 5A and 5B.

Fourth Embodiment

Figure 7A:
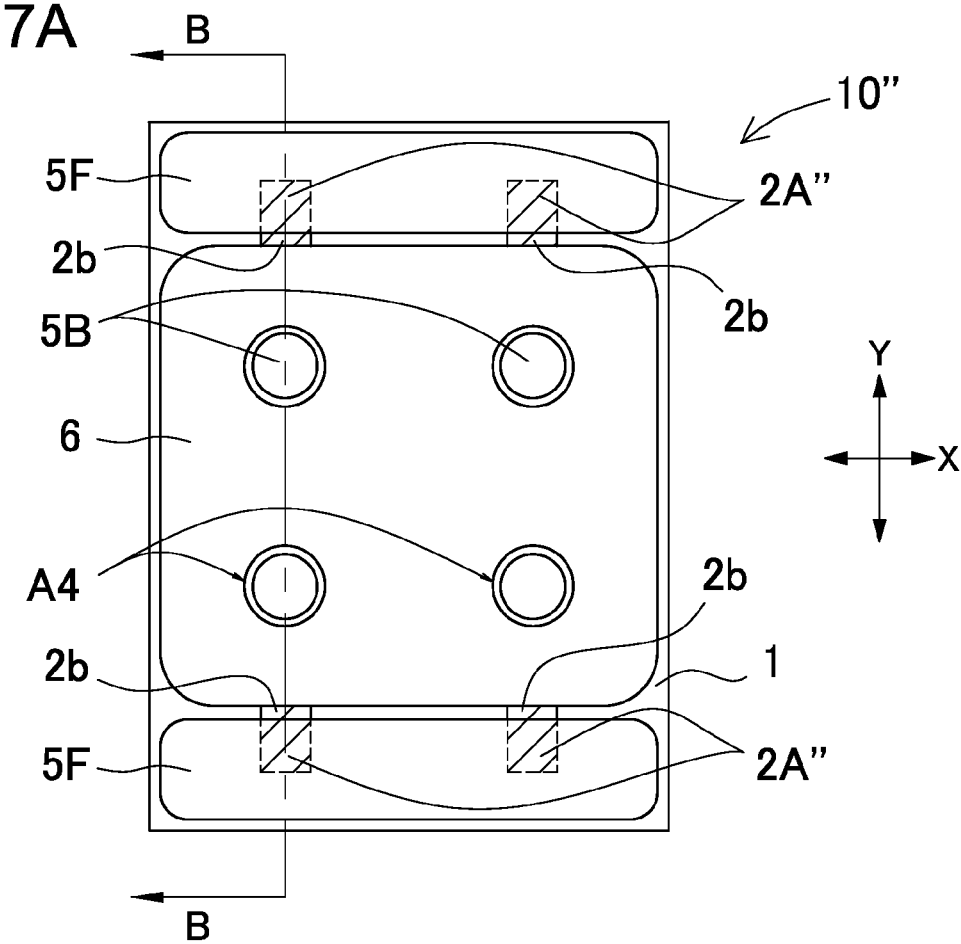
FIG. 7A is a schematic plan view showing a light emitting element according to the fourth embodiment.
Figure 7B:
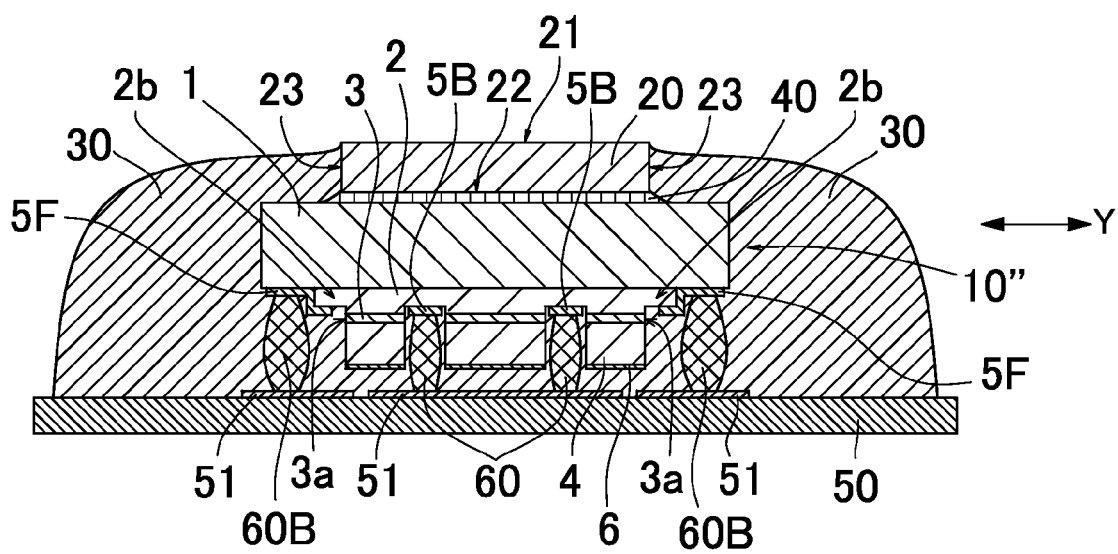
FIG. 7B is a schematic cross-section through the line B-B in FIG. 7A.

Light emitting element for a light emitting device according to the fourth embodiment is shown in the schematic plan view of FIG. 7A and schematic cross section through the line B-B in FIG. 7B. Other than light emitting element 10 structure shown in FIGS. 7A and 7B, component parts of a light emitting device according to fourth embodiment are essentially the same as the above described first embodiment. Accordingly, similar components are indicated by the same reference numbers and for expediency their description is not repeated. In this embodiment as well, hatched areas in FIG. 7A correspond to exposed area 2A" of an n-type semiconductor layer 2. Also, In this embodiment, the exposed area 2A" does not have edge regions, but have end regions at both ends.

As shown in FIG. 7A, each end region (exposed area 2A") has a plurality of protrusions 2b of n-type semiconductor layer 2 that project beyond the wavelength-conversion member 20, and n-side electrodes 5 are provided in a manner covering the light-transmissive substrate 1 and those protrusions 2b in the plane view. Specifically, as shown in FIG. 7B, the protrusions 2b extend beyond the side surfaces 23 of the wavelength-conversion member 20, and for this fourth embodiment, two protrusions 2b are formed in each end region. Here, the n-side electrodes 5 are electrically connected with the protrusions 2b. Since this configuration can reduce the area that light propagated from the active layer 3 into the n-type semiconductor layer 2, and more specifically can reduce the amount of light introduced into n-type regions where repeated reflection results in light absorption inside the n-type semiconductor layer 2, light emission efficiency of the light emitting device 100 can be improved.

The light emitting device of the present invention can be applied suitably as a component in various light source applications such as backlight, display and monitor applications, general lighting, and automotive headlamps. Further, the light emitting device structure is not limited only to inclusion of light emitting elements, but can also be used appropriately with light receiving elements and other semiconductor devices.

What is claimed is:
1. A light emitting device comprising:
a mounting board;
a plurality of light emitting elements arranged with gaps between devices on the mounting board in a first direction;
a wavelength-conversion member disposed on a light extraction side of the light emitting elements in a manner covering the surface of the light emitting elements and the gaps between the light emitting elements, the wavelength-conversion member configured to convert at least a portion of the light emitted by the light emitting elements to a different wavelength, the wavelength-conversion member having side surfaces; and
a light reflective resin that covers perimeter regions of the light emitting elements and the wavelength-conversion member side surfaces,
wherein each of the plurality of light emitting elements has, in order from the light-extraction surface side, an n-type semiconductor layer, an active layer provided in a part of the n-type semiconductor layer and having side faces, and a p-type semiconductor layer provided on the active layer,
wherein n-side electrodes are provided at least in both end regions of the n-type semiconductor layer in a second direction, which is perpendicular to the first direction, and a p-side electrode is provided on the surface of the p-type semiconductor layer,
wherein the wavelength-conversion member is positioned to approximately align both of the wavelength-conversion member side surfaces with both active layer side faces, or to dispose the wavelength-conversion member side surfaces outward of the active layer side faces in the second direction, and
wherein the wavelength-conversion member side surfaces are positioned in the second direction between the active layer side faces and inward facing sides of the n-side electrodes.

2. The light emitting device according to claim 1 wherein the adjacent light emitting elements in the plurality of light emitting elements have their active layer side faces disposed next to each other.

3. The light emitting device according to claim 1 wherein the both end regions having the n-side electrode are covered with the light reflective resin.

4. The light emitting device according to claim 2 wherein the both end regions having the n-side electrode are covered with the light reflective resin.

5. The light emitting device according to claim 1
wherein the light emitting elements located at the ends in the first direction have extended areas that extend beyond the ends of the wavelength-conversion member in the first direction, and
wherein the n-side electrodes are provided on the extended areas.

6. The light emitting device according to claim 2
wherein the light emitting elements located at the ends in the first direction have extended areas that extend beyond the ends of the wavelength-conversion member in the first direction, and
wherein n-side electrodes are provided on the extended areas.

7. The light emitting device according to claim 4
wherein the light emitting elements located at the ends in the first direction have extended areas that extend beyond the ends of the wavelength-conversion member in the first direction, and
wherein n-side electrodes are provided on the extended areas.

8. The light emitting device according to claim 1
wherein light-transmissive substrate is provided on the n-type semiconductor layer extending beyond the n-type semiconductor layer in both end regions in the second direction, and
wherein n-side electrodes are provided that span over the both end regions of the n-type semiconductor and light-transmissive substrate at both ends in the second direction.

9. The light emitting device according to claim 2
wherein light-transmissive substrate is provided on the n-type semiconductor layer extending beyond the n-type semiconductor layer in both end regions in the second direction, and
wherein n-side electrodes are provided that span over the both end regions of the n-type semiconductor and light-transmissive substrate at both ends in the second direction.

10. The light emitting device according to claim 4
wherein light-transmissive substrate is provided on the n-type semiconductor layer extending beyond the n-type semiconductor layer in both end regions in the second direction, and
wherein n-side electrodes are provided that span over the both end regions of the n-type semiconductor and light-transmissive substrate at both ends in the second direction.

11. The light emitting device according to claim 5
wherein light-transmissive substrate is provided on the n-type semiconductor layer extending beyond the n-type semiconductor layer in both end regions in the second direction, and
wherein n-side electrodes are provided that span over the both end regions of the n-type semiconductor and light-transmissive substrate at both ends in the second direction.

12. The light emitting device according to claim 8 wherein the regions where the n-side electrodes are provided are covered with light reflective resin at least over the light-transmissive substrate.

13. The light emitting device according to claim 9 wherein the regions where the n-side electrodes are provided are covered with light reflective resin at least over the light-transmissive substrate.

14. The light emitting device according to claim 10 wherein the regions where the n-side electrodes are provided are covered with light reflective resin at least over the light-transmissive substrate.

15. The light emitting device according to claim 8 wherein n-side electrodes provided in the both end regions extend into areas under the wavelength-conversion member.

16. The light emitting device according to claim 9 wherein n-side electrodes provided in the both end regions extend into areas under the wavelength-conversion member.

17. The light emitting device according to claim 10 wherein n-side electrodes provided in the both end regions extend into areas under the wavelength-conversion member.

18. The light emitting device according to claim 8
wherein the both end regions have a plurality of protrusions formed in a manner protruding the n-type semiconductor layers beyond the wavelength-conversion member, and
wherein n-side electrodes are formed in a manner covering the light-transmissive substrate and the protrusions in the plane view.

19. The light emitting device according to claim 9
wherein the both end regions have a plurality of protrusions formed in a manner protruding the n-type semiconductor layers beyond the wavelength-conversion member, and
wherein n-side electrodes are formed in a manner covering the light-transmissive substrate and the protrusions in the plane view.

20. The light emitting device according to claim 1
wherein the wavelength-conversion member side surfaces are opposite outermost side surfaces of the wavelength-conversion member along the second direction.

* * * * *